United States Patent
Herrault et al.

(10) Patent No.: US 9,842,814 B1
(45) Date of Patent: Dec. 12, 2017

(54) INTEGRATED RF SUBSYSTEM

(71) Applicant: HRL Laboratories, LLC, Malibu, CA (US)

(72) Inventors: Florian G. Herrault, Agoura Hills, CA (US); Miroslav Micovic, Thousand Oaks, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 15/136,835

(22) Filed: Apr. 22, 2016

(51) Int. Cl.
| H01L 23/66 | (2006.01) |
| H01L 23/498 | (2006.01) |
| H01L 23/367 | (2006.01) |
| H01L 23/373 | (2006.01) |
| H01L 23/053 | (2006.01) |
| H01L 23/08 | (2006.01) |
| H01L 21/78 | (2006.01) |
| H01L 21/321 | (2006.01) |
| H01L 21/48 | (2006.01) |

(52) U.S. Cl.
CPC ........ *H01L 23/66* (2013.01); *H01L 21/32115* (2013.01); *H01L 21/4817* (2013.01); *H01L 21/4846* (2013.01); *H01L 21/4871* (2013.01); *H01L 21/78* (2013.01); *H01L 23/053* (2013.01); *H01L 23/08* (2013.01); *H01L 23/3675* (2013.01); *H01L 23/3736* (2013.01); *H01L 23/49838* (2013.01); *H01L 2223/6627* (2013.01); *H01L 2223/6644* (2013.01); *H01L 2223/6677* (2013.01); *H01L 2223/6683* (2013.01)

(58) Field of Classification Search
CPC ........................................... H01L 23/66
See application file for complete search history.

(56) References Cited

U.S. PATENT DOCUMENTS

| 8,237,228 B2 * | 8/2012 | Or-Bach ............... G03F 9/7076 |
| | | 257/369 |
| 9,337,124 B1 * | 5/2016 | Herrault ............... H01L 23/3736 |

OTHER PUBLICATIONS

Radisic et al., "220-GHz Solid-State Power Amplifier Modules," IEEE Journal of Solid-State Circuits, 47(10) 2291-2297, Oct. 2012.
Samoska, "An Overview of Solid-State Integrated Circuit Amplifiers in the Submillimeter-Wave and THz Regime," IEEE Transactions on Terahertz Science and Technology, 1(1): 9-24, Sep. 2011.

* cited by examiner

*Primary Examiner* — Fernando L Toledo
*Assistant Examiner* — Valerie N Newton
(74) *Attorney, Agent, or Firm* — Lewis Roca Rothgerber Christie, LLP

(57) ABSTRACT

There is provided an integrated RF subsystem including a chip substrate, a circuit patterned on a first surface of the chip substrate, a probe electrically integrated with the circuit on a first side of the chip substrate, a frame at a second side of the chip substrate defining a first cavity underneath the circuit.

23 Claims, 11 Drawing Sheets

INTEGRATED RF SUBSYSTEM

CROSS-REFERENCE TO RELATED APPLICATION(S)

This application is related to U.S. patent application Ser. No. 14/532,761 ("Method of Integration of Wafer Level Heat Spreaders and Backside Interconnects on Microelectronics Wafers"), filed on Nov. 4, 2014, the entire content of which is incorporated herein by reference.

FIELD

Aspects of the invention relate to the field of waveguide integration of radio frequency modules.

BACKGROUND

Packaging of high-frequency chips, such as GaN-on-SiC chips, which may, for example, be used in power amplifier modules, is particularly challenging because one needs to address issues with electromagnetic discontinuities, thermal management, and cost. Currently, existing methods of chip integration into waveguide rely on a eutectic die attach into a machined waveguide that features a pedestal to position the chip at the right level within the waveguide. The eutectic solder (made of, e.g., AuSn) is a poor thermal conductor (with a thermal conductivity of about 50 W/mK), and the die attach suffers from reliability and planarity issues. Further, this is a serial pick-and-place type mounting, which may suffer from placement accuracy and is costly. Furthermore, the waveguide pedestal needs to be specifically machined to accurate dimensions, which increases manufacturing costs and reduces reliability.

Integration of high-power RF front-ends for radar systems, communications systems, and the like, also present a thermal management challenge. For example, a comparable phased array heat exchanger may add about 7 inches in height and about 100 lbs in weight to a communications system, which may be prohibitive for use in compact radars and unmanned aerial vehicles (UAVs).

The above information disclosed in this Background section is only for enhancement of understanding of the background of the invention, and therefore it may contain information that does not form the prior art that is already known to a person of ordinary skill in the art.

SUMMARY

Aspects of embodiments of the invention are directed toward a wafer-level integration approach that combines a high-performance heat spreader directly in contact with the back of a chip (e.g., a monolithic microwave integrated circuit (MMIC) chip), and integrated e-plane probes for ease of integration with a waveguide (e.g., a micromachined waveguide).

Aspects of embodiments of the invention are directed toward a compact, low cost, low power, and manufacturable wafer-level integration solution for RF subsystems that addresses thermal management and integration limitations in high-frequency subsystems featuring high-power-density active devices, such as GaN devices and GaN radio frequency (RF) MMICs. As interconnection is particularly important for high frequency systems where long wirebonds are prohibitive due to their parasitic inductances, the wafer-scale thermal management and interconnect integration solution of the present invention offers substantial cost savings compared to chip-level integration, in particular, as fabrication yields of wide-bandgap device wafers are increasing.

According to some exemplary embodiments of the invention, there is provided an integrated RF subsystem including: a chip substrate extending along a first direction; a circuit patterned on a first surface of the chip substrate; a probe electrically integrated with the circuit on a first side of the chip substrate, the probe and the circuit extending along the first direction; and a frame at a second side of the chip substrate and including: a first side wall and a second side wall, the first and second side walls extending along the first direction; a first cross wall and a second cross wall, the first and second cross walls laterally spaced from one another and extending along a second direction crossing the first direction, the first wall being spaced from an edge of the chip substrate; and a base parallel to the chip substrate, wherein the first cross wall, the first and second side walls, and the base define a partial cavity at the edge of the chip substrate, and the first and second side walls and the first and second cross walls define a full cavity under the circuit.

In an embodiment, the probe includes an e-plane probe configured to receive an electromagnetic wave signal and to transmit an electrical signal to the circuit, the electrical signal corresponding to the electromagnetic wave signal.

In an embodiment, a surface of the base facing the second side of the chip substrate is coated with an electrically conductive layer having a conductivity from about $30 \times 10^6$ siemens/m to about $65 \times 10^6$ siemens/m.

In an embodiment, the integrated RF subsystem further includes a heat spreader in the full cavity and configured to dissipate heat generated by the circuit.

In an embodiment, the heat spreader contacts a second surface of the chip substrate.

In an embodiment, the heat spreader includes electroformed high thermal conductivity material including one or more of copper, copper alloys, silver, and gold.

In an embodiment, an entire top surface of the frame is bonded to a second surface of the chip substrate.

In an embodiment, the first cross wall is aligned with an edge of the circuit coupled to the probe.

In an embodiment, the partial cavity is configured to match a profile of, and be electromagnetically coupled to, a waveguide, the probe being positioned at a center of a cross-section of the waveguide orthogonal to the first direction.

In an embodiment, thicknesses of the first and second side walls and the base are substantially the same as those of corresponding walls of a waveguide coupled to the integrated RF subsystem.

In an embodiment, the circuit includes a monolithic microwave integrated circuit (MMIC).

In an embodiment, the frame includes one or more of Si, SiC, GaAs, GaN, InP, sapphire, and quartz.

According to some exemplary embodiments of the invention, there is provided an method of forming a wafer-level-fabricated RF subsystem, the method including: receiving a mesh wafer having a plurality of full cavities arranged in matrix-form, and including a plurality of partition walls between the plurality of full cavities and extending along a first direction and having a plurality of partial cavities arranged in matrix-form between the plurality of full cavities and the plurality of partition walls; receiving an integrated circuit (IC) wafer including a plurality of circuits; integrating a plurality of probes with the plurality of circuits on a first surface of the IC wafer; aligning the mesh wafer with the IC wafer such that the plurality of partition walls of the mesh wafer are aligned to dicing streets between the plurality of circuits; bonding the mesh wafer to a second surface of the IC wafer, the second surface facing oppositely from opposite the first surface; and depositing a thermal heat spreader material in the plurality of full cavities to contact the second surface of the mesh wafer.

In an embodiment, the full cavities are wafer-through openings and the partial cavities are not wafer-through openings.

In an embodiment, the plurality of partial cavities are coated with an electrically conductive layer to form part of a waveguide, the electrically conductive layer having a conductivity from about $30 \times 10^6$ siemens/m to about $65 \times 10^6$ siemens/m.

In an embodiment, each of the plurality of full cavities corresponds in size to a respective circuit of the plurality of circuits.

In an embodiment, the method further includes cutting the mesh wafer and the IC wafer along the dicing streets of the IC wafer to form a plurality of integrated RF subsystems, each of the plurality of integrated RF subsystems being integrated with a probe of the plurality of probes and a heat spreader of the thermal heat spreader material.

In an embodiment, the method further includes performing planarization to level the thermal heat spreader material with a backside of the mesh wafer, the backside facing oppositely from opposite the second surface of the IC wafer.

In an embodiment, the bonding further includes attaching an entire top surface of the mesh wafer to a backside of the IC wafer.

In an embodiment, the depositing of the thermal heat spreader material includes electroforming a high thermal conductivity material including one or more of copper, copper alloys, silver, and gold as the thermal heat spreader material.

BRIEF DESCRIPTION OF THE DRAWINGS

The above and other features and aspects of the invention will be made more apparent by the following detailed description of exemplary embodiments thereof with reference to the attached drawings, in which.

DETAILED DESCRIPTION

Figure 1A:
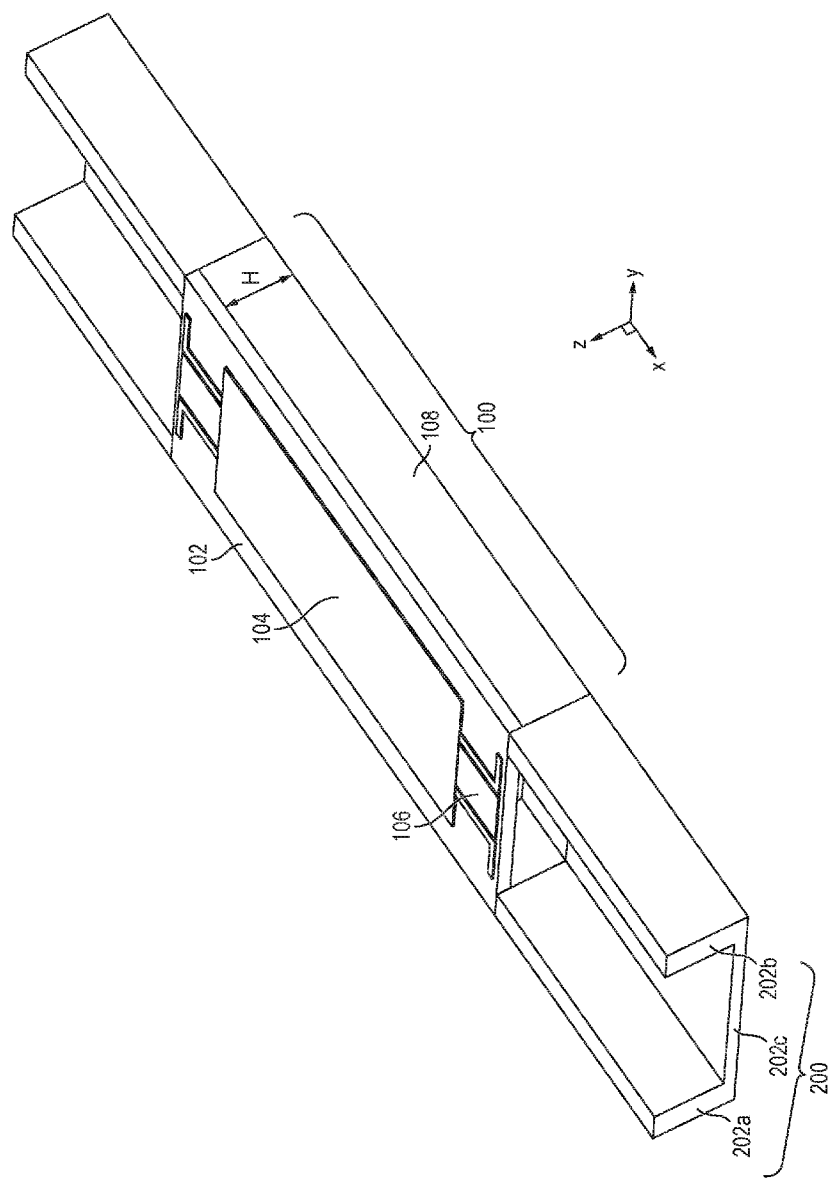
FIG. 1A is a perspective cutaway view of an integrated RF subsystem assembled with a waveguide, according to some embodiments of the present invention.

The attached drawings for illustrating exemplary embodiments of the invention are referred to in order to provide a sufficient understanding of the invention, the merits thereof, and the objectives accomplished by the implementation of the invention. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the invention will be described in detail by explaining exemplary embodiments of the invention with reference to the attached drawings. In the drawings, like reference numerals are used throughout the figures to reference like features and components.

Aspects of embodiments of the present invention are directed toward wafer-level integration of thermal heat spreaders, mechanical packaging material, and through-package backside interconnects.

Embodiments of the present invention enable wafer-level integration of waveguide-to-chip transitions via low-loss, on-wafer suspended e-plane probes, and enable thermal management through an electroplated heat spreader within a mesh backing. The integrated RF subsystem may be positioned between input and output matching waveguides (e.g., WR4 waveguides) due to the high-accuracy micromachining of the subsystem.

Figure 1B:
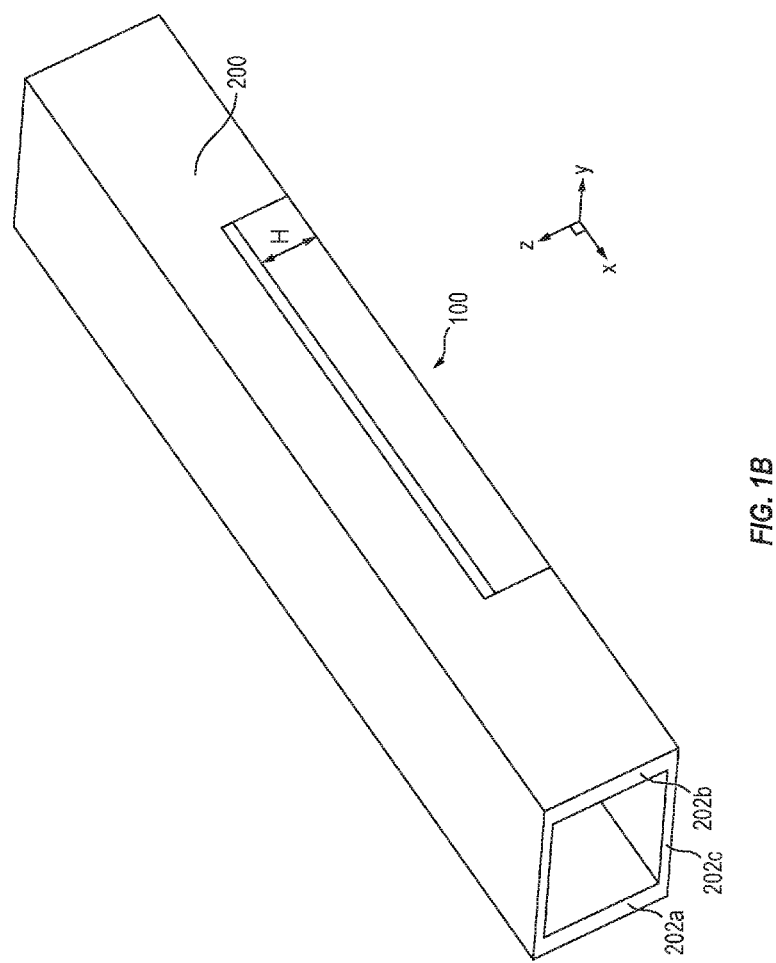
FIG. 1B is a perspective view of the integrated RF subsystem assembled with the full waveguide, according to some embodiments of the present invention.

FIG. 1A is a perspective cutaway view of an integrated RF subsystem 100 assembled with a waveguide 200, according to some embodiments of the present invention. FIG. 1B is a perspective view of the integrated RF subsystem 100 assembled with the full waveguide 200, according to some embodiments of the present invention.

According to some embodiments, the integrated RF subsystem (e.g., the wafer-level-fabricated RF subsystem) 100 includes a chip substrate 102, a circuit (e.g., an RF integrated circuit (RFIC)) 104 fabricated on (e.g., patterned on) a top surface of the chip substrate 102, a probe (e.g., an e-plane probe) 106 coupled to (e.g., electrically integrated with) the circuit 104, and a frame 108 on a backside of the chip substrate 102. The frame 108 may house a heat spreader (e.g., a wafer-level thermal heat spreader) configured to transfer (e.g., dissipate) the heat generated by the circuit 104 (and passed through the backside of the chip substrate 102) to the external environment. In some examples, the circuit 104 may be a radio frequency (RF) monolithic microwave integrated circuit (MMIC) chip, which utilizes an RF technology such as GaN, InP, GaAs, and/or the like. In some embodiments, the probe 106 is an e-plane probe configured as a low-loss waveguide-to-chip transition. For example, the probe 106 may transfer an RF signal traveling through the waveguide (e.g., a WR4 waveguide) 200 to the circuit 104 for processing, or emits an RF signal output from the circuit 104 for propagation through the waveguide 200. In some examples, when integrated in the waveguide 200, the circuit 104 may include circuitry, such as a bidirectional transceiver, that is coupled at opposite ends to two e-plane probes 106. However, embodiments of the present invention are not limited thereto. For example, when the integrated RF subsystem 100 is utilized at a terminal end of a waveguide, the circuit 104 may include a transmitter or a receiver and be coupled to only one probe 106.

According to some embodiments, the height H of the frame 108 is uniform (substantially uniform) across the length of the frame 108 extending along the first direction (e.g., the X-axis), and is chosen such that the probe 106 is positioned near (or at) a focal point within the waveguide 200, for example, the cross-sectional center of the waveguide 200, in order to increase (e.g., to maximize) the signal strength of the RF signal captured or emitted by the probe 106. However, embodiments of the present invention are not limited thereto, and the height H of the frame 108 may be adjusted to position the probe 106 at any other suitable location within the waveguide 200. In some examples, the height H of the frame 108 may be about 50 μm to about 5000 μm, the thickness of the frame 108 (e.g., thickness at the base 116a) may be about 5 to about 5000 μm (e.g., 50 μm), and the width of the entire frame 108 may be about 1 mm to about 10 mm (e.g., about 0.5 mm greater than the width of the circuit 104).

To reduce (e.g., minimize) discontinuities between the waveguide 200 and the integrated RF subsystem 100, the cross-sectional profile of the integrated RF subsystem 100 may match that of the waveguide 200, as illustrated in FIGS. 1A and 1B. For example, the thickness of and spacing between first and second sidewalls 112a and 112b of the frame 108 may match those of the walls 202a and 202b of the waveguide 200, and the thickness and vertical position (e.g., along the Z-axis) of the wall 202c of the waveguide 200 may match the base 116a of the frame 108 when the integrated RF subsystem 100 is assembled with the waveguide 200.

Figure 2A:
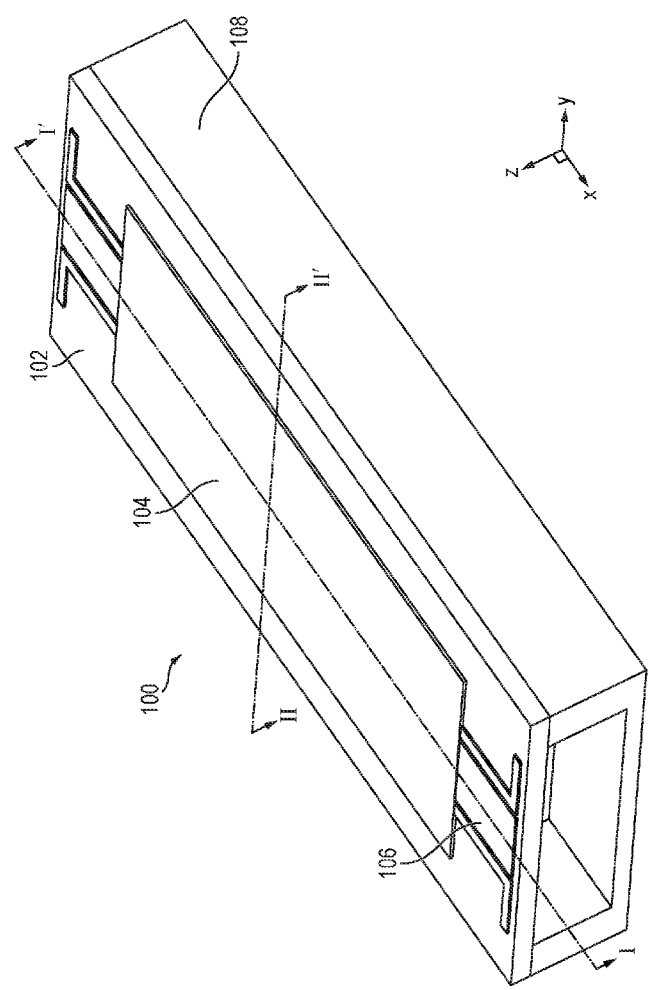
FIG. 2A is a perspective view of an integrated RF subsystem, according to some embodiments of the present invention.
Figure 2B:
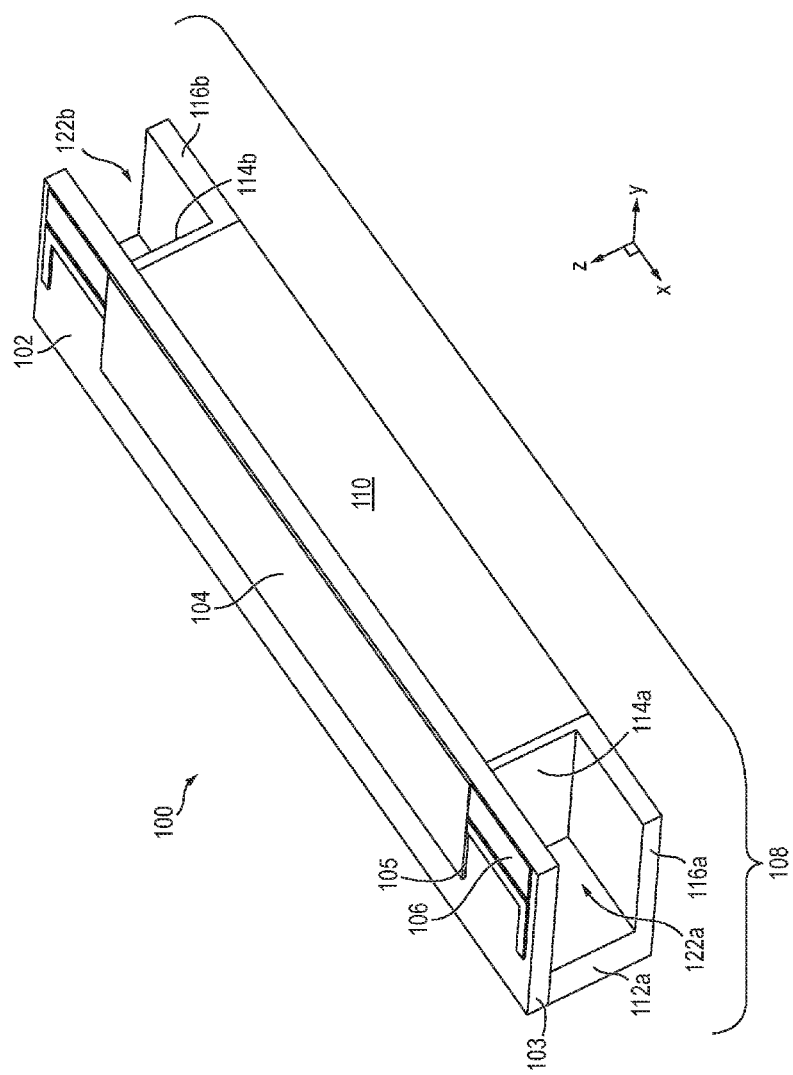
FIGS. 2B-2C are cutaway views of the integrated RF subsystem of FIG. 2A along lines I-I' and II-II', respectively.
Figure 2C:
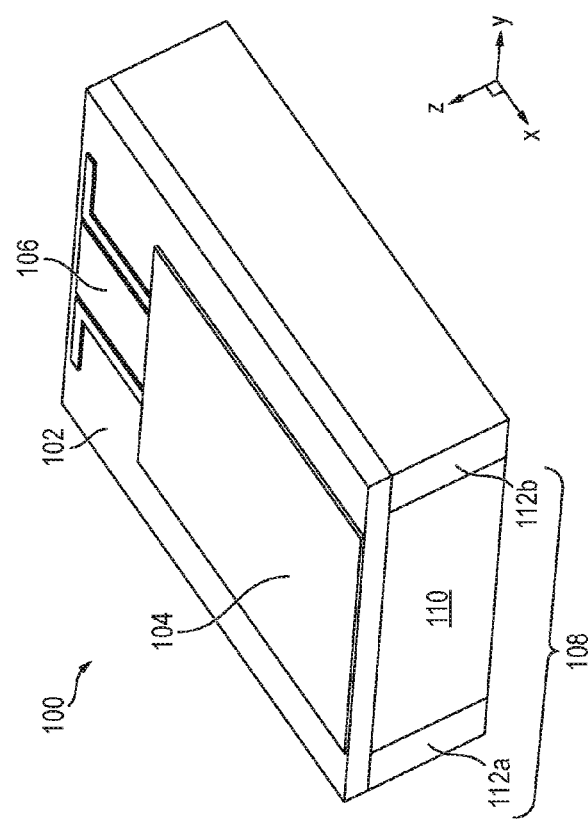
Figure 2D:
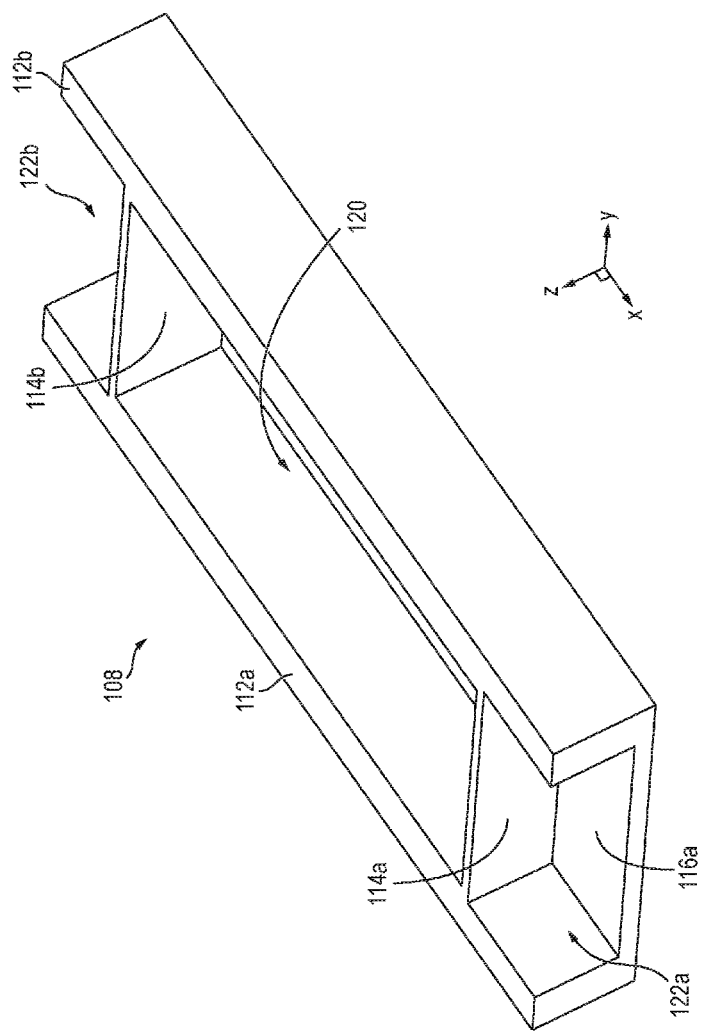
FIG. 2D is a perspective view of a frame forming part of the integrated RF subsystem.

FIG. 2A is a perspective view of an integrated RF subsystem 100, according to some embodiments of the present invention. FIGS. 2B and 2C are cutaway views of the integrated RF subsystem 100 of FIG. 2A along lines I-I' and II-II', respectively. FIG. 2D is a perspective view of a frame 108 forming part of the integrated RF subsystem 100.

According to some embodiments, the frame 108 is bonded (e.g., via a polymer-based bonding layer) to the backside of the chip substrate 102 and is configured to mechanically support the chip substrate 102, to fix the position of the circuit 104 and the probe 106 with respect to the waveguide 200 coupled to the integrated RF subsystem 100, and to facilitate the dissipation of heat generated by the operation of the circuit 104 to the external environment (e.g., to the outside of the waveguide 200). In some examples, the frame 108 may be formed of a substrate material such as Si, SiC, GaAs, GaN, InP, sapphire, quartz, and/or the like.

In some embodiments, the heat spreader (e.g., thermal heat spreader) 110 is contained within a cavity defined by the frame 108 and contacts the backside of the chip substrate 102 to increase (e.g., maximize) heat dissipation from the circuit 104. In some examples, the heat spreader 110 may be electroformed using high thermal conductivity materials, such as copper, copper alloys, silver, gold, and/or the like.

Referring to FIG. 2D, the frame 108 includes first and second sidewalls 112a and 112b, first and second cross walls 114a and 114b, and first and second bases 116a and 116b. The first and second sidewalls 112a and 112b both extend along a first direction (e.g., along the X-axis) and are laterally spaced from one another along a second direction (e.g., along the Y-direction) crossing (e.g., orthogonal to) the first direction. The first and second cross walls 114a and 114b extend along the second direction and are laterally spaced from one another along the first direction. The first and second sidewalls 112a and 112b and the first and second cross walls 114a and 114b define a cavity (e.g., a full cavity, first cavity, or wafer-through cavity) 120 therebetween, which houses the heat spreader 110. The first and second bases 116a and 116b are positioned opposite the chip substrate 102 at the bottom of the frame 108 and extend parallel to the chip substrate 102. The first and second sidewalls 112a and 112b define a first partial cavity (e.g., a second cavity) 122a along with the first cross wall 114a and the first base 116a, and define a second partial cavity (e.g., a third cavity) 122b along with the second cross wall 114b and the second base 116b. The first and second partial cavities 122a and 122b are configured to substantially maintain waveguide continuity at the junctions where the waveguide 200 are coupled to the integrated RF subsystem 100, to reduce (e.g., minimize) losses at the junctions.

According to some embodiments, cross-sectional profile of the frame 108 may be matched to that of the waveguide 200 in order to increase (e.g., maximize) electrical continuity between the waveguide 200 and the integrated RF subsystem 100. For example, the spacing between, and the thickness of each of, the first and second sidewalls 112a and 112b may be equal to those of the corresponding sidewalls of the waveguide 200.

As the first cross wall 114a is positioned further away from the substrate edge 103 (e.g., moved along the X-axis), the dielectric loading under the probe 106 (e.g., the parasitic capacitance between the probe 106 and the first cross wall 114a) decreases, which may be a desirable effect. However, increasing the distance between the substrate edge 103 and the first cross wall 114a also reduces the volume of the cavity (e.g., first cavity) 120 and the contact area between the heat spreader 110 and the back of the chip substrate 102, which adversely affects the ability of the heat spreader 110 to dissipate heat generated by the circuit 104. In some embodiments, a balance between reducing dielectric loading (e.g., parasitic capacitance) and increasing thermal dissipation may be reached by positioning the first and second cross walls 114a and 114b to be vertically aligned with corresponding edges of circuit 104. For example, as is illustrated in FIG. 2B, the chip edge 105 and the first cross wall 114a may be at a same distance from the substrate edge 103. However, embodiments of the present invention are not limited thereto, and the first and second cross walls 114a and 114b may be positioned at any suitable location along the first direction (e.g., along the X-axis) as determined by heat dissipation and dielectric loading requirements/limitations of a particular design or application.

Figure 3:
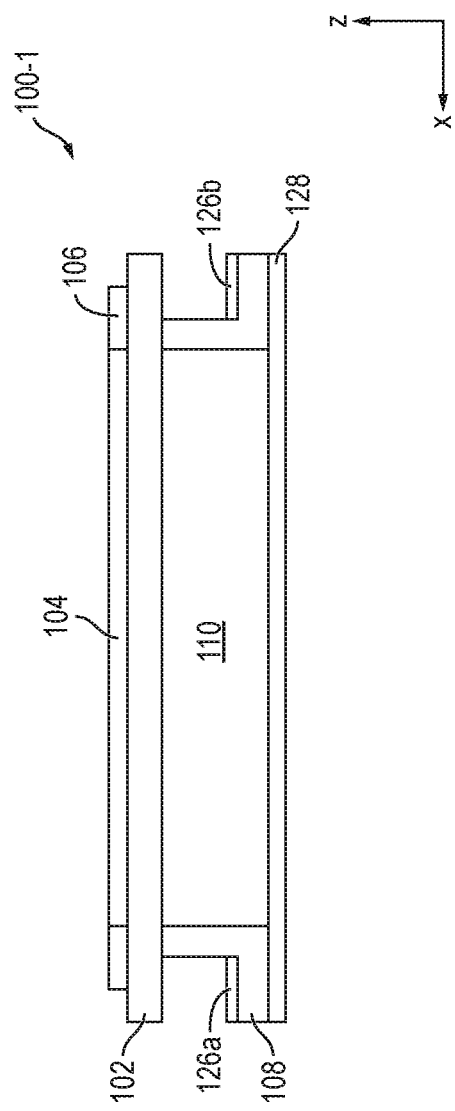
FIG. 3 is a cross-sectional view of an integrated RF subsystem having an electroplated frame, according to some embodiments of the present invention.

FIG. 3 is a cross-sectional view of an integrated RF subsystem 100-1 having an electroplated frame 108, according to some embodiments of the present invention. The integrated RF subsystem 100-1 is substantially similar in design and operation to the integrated RF subsystem 100-1 described above with respect to the embodiments of FIGS. 1A-1B and 2A-2D. As such, a detailed description of the integrated RF subsystem 100-1 may not be repeated herein.

As illustrated in FIG. 3, according to some embodiments, the first and second partial cavities 122a and 122b of frame 108 of the integrated RF subsystem 100-1 may be metalized (coated with a highly conductive layer) so that the partial cavities 122a and 122b behave as part of the waveguide 200, and so that continuity at the junction between the integrated RF subsystem 100-1 and the waveguide 200 may be improved. For example, the top surfaces of the first and second bases 116a and 116b facing the chip substrate 102 may be coated with a high conductivity metal, such as gold and/or the like, to form metalized layers 126a and 126b, which may improve continuity (of electrical conductivity) at the junction of the integrated RF subsystem 100-1 and the waveguide 200. In some examples, a surface at the bottom of the frame 108 and the heat spreader 110, which is across from and facing away from the backside of the chip substrate 102, may also be coated with a same or similar high conductivity metal to form the metalized exterior layer 128. The metalized layer 128 may serve as an oxidation barrier for the heat spreader 110, while maintaining high thermal conductivity and electrical conductivity.

While in the exemplary embodiments of FIGS. 1A-1B, 2A-2D, and 3 the integrated RF subsystems 100 and 100-1 are symmetrical along the first direction (e.g., along the X-axis), embodiments of the present invention are not limited thereto. For example, the first and second cross walls 114a and 114b may be positioned at different distances from corresponding edges of the chip substrate 102. In some examples, the circuit 104 may be coupled to only one probe 106 (as opposed to two), and the integrated RF subsystems 100 (or 100-1) may have only one partial cavity (i.e., have either the first partial cavity 122a or the second partial cavity 122b).

The exemplary embodiments of the present invention illustrated in FIGS. 1A-1B and 2A-2D utilize a rectangular waveguide 200 and, thus, a frame 108 having a rectangular profile. However, embodiments of the present invention are not limited thereto, and the waveguide 200 and frame 108 may have any suitable cross-sectional shape as dictated by waveguide design parameters.

According to some embodiments, the first and second walls 112a and 112b of the frame 108 may only define the full cavity (e.g., the first cavity) 120, and may not extend past (e.g., be later cut to terminate at) the cross walls 114a and 114b. Such embodiments may also omit (e.g., not include) the first and second bases 116a and 116b, such that the waveguide 200 can be sleeved over the integrated RF subsystem 100 during assembly.

Figure 4A:
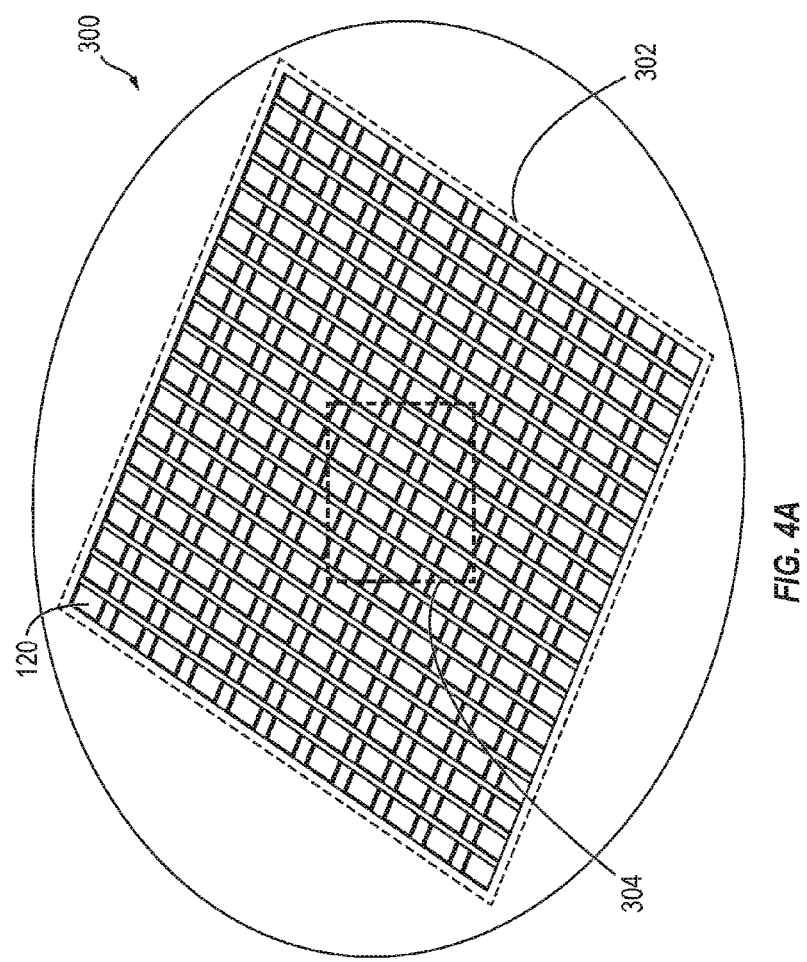
FIG. 4A illustrates a mesh wafer used to form the frame of the integrated RF subsystems, according to some embodiments of the present invention.
Figure 4B:
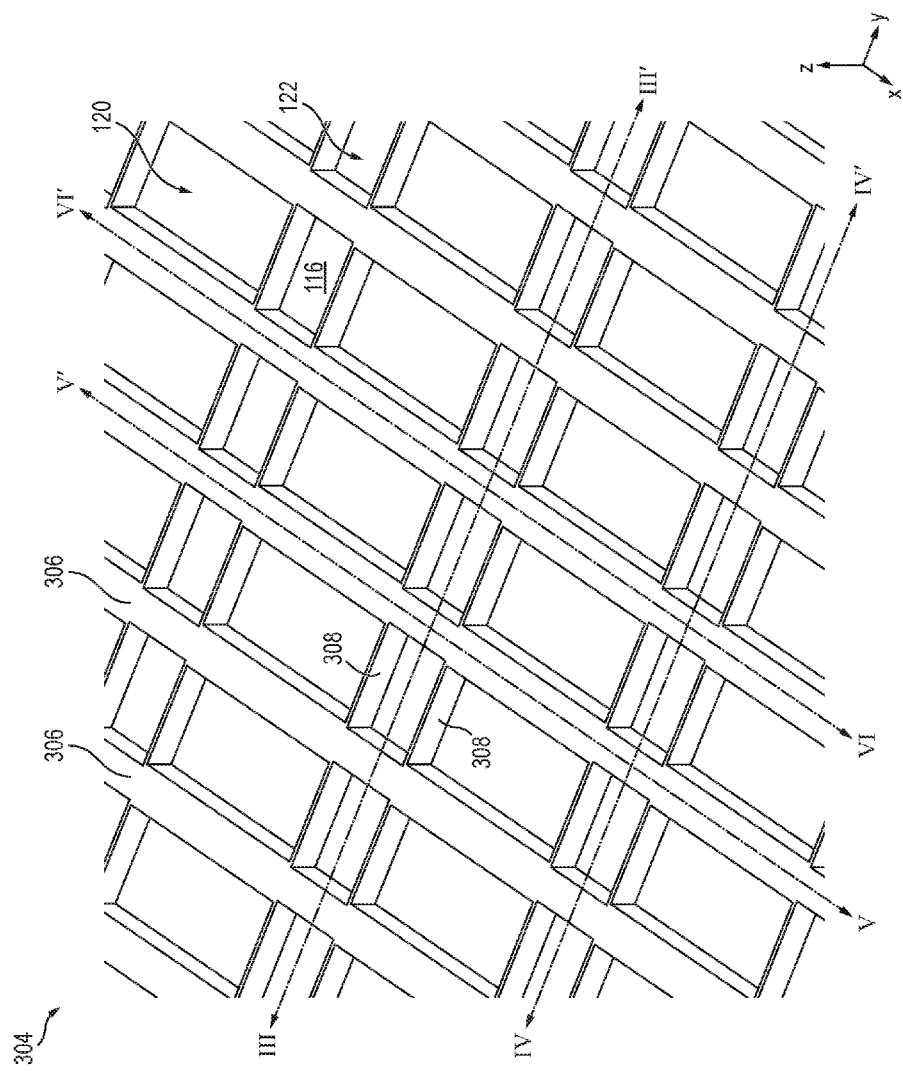
FIG. 4B illustrates an enlarged view of a portion of the mesh wafer of FIG. 4A.

FIG. 4A illustrates a mesh wafer 300 used to form the frame 108 of the integrated RF subsystems 100 and 100-1, according to some embodiments of the present invention. FIG. 4B illustrates an enlarged view of a portion 304 of the mesh wafer 300 of FIG. 4A.

Referring to FIGS. 4A-4B, the mesh wafer 300 may be fabricated to include a mesh 302 used to form a plurality of frames 108. According to some embodiments, the mesh 302 includes a plurality of first partition walls 306 extending substantially in parallel along the first direction (e.g., along the X-axis) and a plurality of second partition walls 308 crossing (e.g., intersecting) the plurality of first partition walls 306 and extending substantially in parallel along the second direction (e.g., along the Y-axis). Crossings of the plurality of first and second partition walls 306 and 308 define a plurality of full cavities (a plurality of first cavities) 120 that may be wafer-through openings arranged in matrix-form and a plurality of partial cavities (e.g., a plurality of second cavities) 122 that are bound at the bottom surface of mesh wafer 300 by bases 116. However, embodiments of the present invention are not limited thereto, and the plurality of full cavities may not be wafer-through cavities and may be bounded at a suitable location along the thickness direction (e.g., along the Z-axis) of the mesh wafer 300. Some of the techniques used to form the mesh wafer 300 are described in detail in U.S. patent application Ser. No. 14/532,761.

In some embodiments, the plurality of partial cavities 122 (e.g., the top surfaces of the plurality of bases 116) are coated with high conductivity metal, such as gold and/or the like.

Cutting (e.g., slicing or etching) the mesh wafer 300 along the plurality of first partition walls 306 (e.g., along lines III-III' and IV-IV') and proximate ones of the plurality of second partition walls 308 (e.g., along lines V-V' and VI-VI') produces a plurality of frames 108. Cutting may be performed using a laser, dicing saw or blade, and/or any other suitable mechanism known to a person of ordinary skill in the art.

In some examples, the mesh wafer 300 may be formed of a substrate material such as Si, SiC, GaAs, GaN, InP, sapphire, quartz, and/or the like. The thickness of the mesh wafer 300 (e.g., at the plurality of first partition walls 306) may be about 50 µm to about 1000 µm. However, embodiments of the present invention are not limited thereto, and the mesh wafer 300 may have any suitable thickness as dictated by design and application needs.

Figure 5:
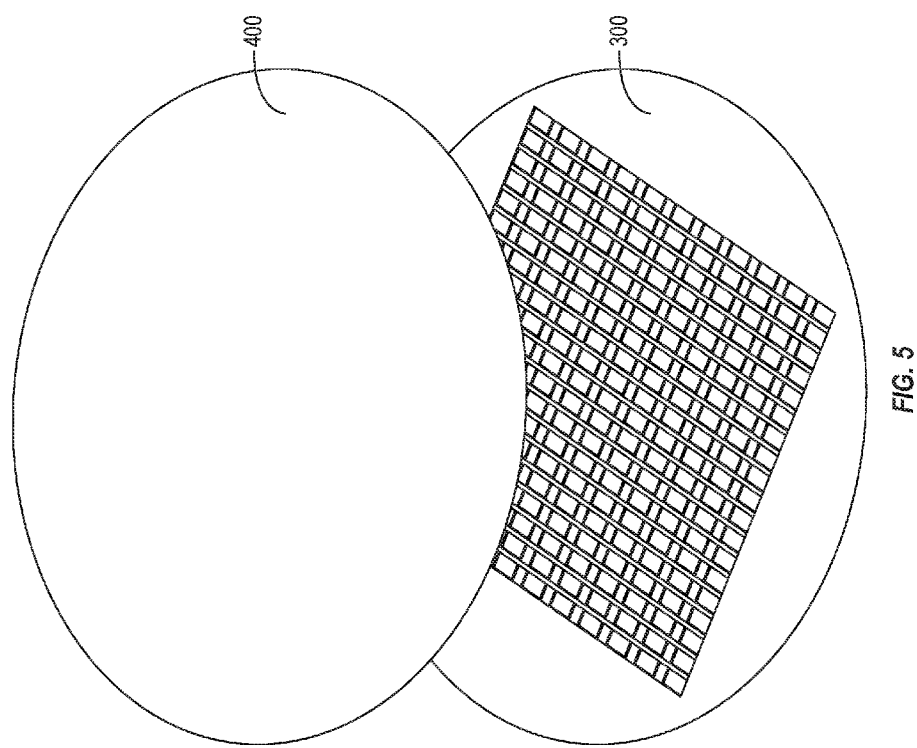
FIG. 5 illustrates a process of forming a plurality of integrated RF subsystems, according to some embodiments of the present invention.

FIG. 5 illustrates a process of forming a plurality of integrated RF subsystems 100 (or 100-1) according to some embodiments of the present invention.

Referring to FIG. 5, an integrated circuit (IC) wafer 400 is mounted using temporary adhesive onto a carrier for backside processing, which, for example, may include wafer thinning/polishing, via etching, and backside metallization (e.g., using electroplated gold). On the front-side of the IC wafer 400, a plurality of circuits 104 are defined through microelectronics processing and fabrication techniques, as would be known to a person of ordinary skill in the art. The IC wafer 400 may be formed of Si, SiC, GaAs, GaN, InP, sapphire, quartz, and/or any other suitable microelectronic substrate material. The carrier may be a Si wafer, a glass wafer, or any other suitable carrier board, such as a printed circuit board (made of, e.g., Teflon, FR4, duroid, liquid crystal polymer, and/or the like).

In some embodiments, the probes 106 are co-fabricated with the plurality of circuits 104 via a wafer-level process. For example, as the probes 106 include thick electroplated metal, the probes 106 may be fabricated concurrently with the circuit interconnects and transmission lines of the plurality of circuits 104.

The mesh wafer 300, as described above with reference to FIGS. 4A-4B, is also provided. The mesh wafer 300 is then aligned and bonded onto the backside of the IC wafer 400. Any bonding technology, such as polymer bonding, thermocompression, eutectic bonding, and/or the like, may be utilized. The alignment of the mesh and IC wafers 300 and 400 may be performed such that gaps between individual chips 104 (also referred to as "dicing streets") are aligned with the plurality of first and second partition walls 306 and 308, and such that each of the circuits 104 is centered on top of a corresponding one of the cavities 120. The wafer-to-wafer alignment may be performed using alignment marks or any other suitable mechanism known to a person of ordinary skill in the art.

The heat spreader 110 is then electroformed using high thermal conductivity materials, such as copper, copper alloys, silver, gold, or any other electroplated composites known by a person of ordinary skill in the art. A planarization step may be performed to level the heat spreader 110 with the backside of the mesh wafer 300. Finally, the two-wafer stack of the mesh and IC wafers 300 and 400 is released from the carrier, and diced into individual integrated RF subsystems 100 (or 100-1), which include a chip (e.g., MMIC chip) 104 with probes (e.g., e-plane probes) 106 and embedded heat spreader 110. Dicing may occur along lines III-III' and IV-IV' and along lines V-V' and VI-VI', for example.

Thus, wafer-level integration of the heat spreader 110 on the back of a MMIC wafer is achieved, which results in enhanced thermal management and facilitates module integration. In some examples, the aforementioned wafer-level integration exhibits an increase in power handling of about 40% or higher.

Figure 6:
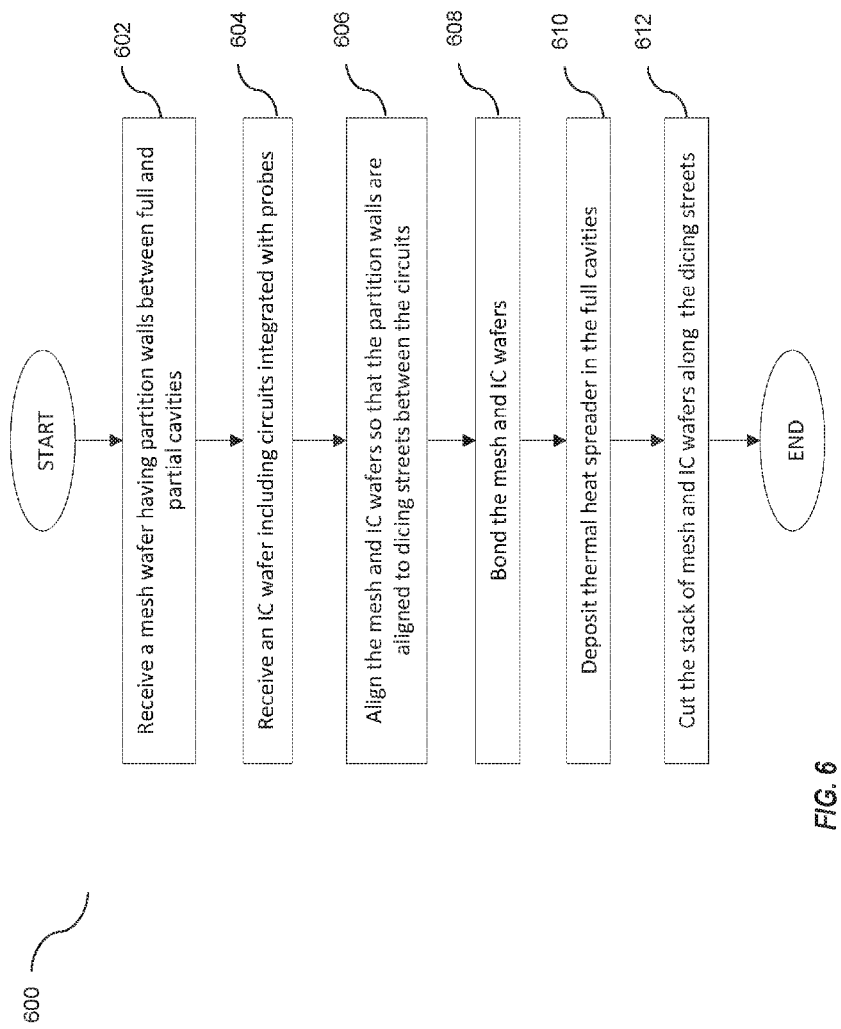
FIG. 6 illustrates a method of forming an integrated, wafer-level-fabricated RF subsystem, according to some example embodiments of the present invention.

FIG. 6 illustrates a method 600 of forming an integrated, wafer-level-fabricated RF subsystem, according to some example embodiments of the present invention.

In act 602, a mesh wafer 300 having a plurality of full cavities 120 arranged in matrix-form is formed (e.g., via micromachining or any other suitable fabrication technology). The mesh wafer 300 includes a plurality of partition walls 306 between the plurality of full cavities 120, which extend along a first direction (e.g., along the X-axis) and a plurality of partial cavities 122 arranged in matrix-form between the plurality of full cavities 120 and the plurality of partition walls 306. In some embodiments, the full cavities 120 are wafer-through openings and the partial cavities 122 are not wafer-through. In some examples, the partial cavities 122 (e.g., bases 116 of the partial cavities 122) are coated with an electrically conductive layer having a conductivity ranging from, for example, about $30 \times 10^6$ Siemens/m to about $65 \times 10^6$ Siemens/m.

In act 604, an IC wafer 400 including a plurality of circuits 104 integrated with the plurality of circuits 104 is received.

In act 606, the mesh wafer 300 is aligned with the IC wafer 400 such that the plurality of partition walls 306 of the mesh wafer 300 are aligned to dicing streets between the plurality of circuits 104.

In act 608, the mesh wafer 300 is bonded to a second surface of the IC wafer 400 opposite the first surface, such that an entire top surface of the mesh wafer 300 is bonded to a backside of the IC wafer 400.

In act 610, a thermal heat spreader material 110 is deposited (e.g., electroformed) in the plurality of full cavities 120 to contact the second surface of the IC wafer 400. In some examples, the thermal heat spreader material 110 may include a high thermal conductivity material such as copper, copper alloys, silver, gold, and/or the like. In some embodiments, planarization is then performed to level the thermal heat spreader material 110 with a backside of the mesh wafer 300.

In act 612, the stack made of the mesh wafer 300 and the IC wafer 400 is cut along the dicing streets of the IC wafer 400 to form a plurality of integrated RF subsystems 100, each of which is integrated with a probe of the plurality of probes 106 and a heat spreader of the thermal heat spreader material 110.

According to some embodiments, each of the plurality of full cavities 120 corresponds in size to a respective circuit of the plurality of circuits 104.

Accordingly, conventional, low-cost micromachining techniques may be used to create small size, highly efficient, wafer-scale-integrated thermal management at the wide band-gap device level. Co-designing the 3D integrated RF front-end with a thermal management system (e.g., a cooling system), according to embodiments of the present invention, permits improved size, weight, and power consumption (SWaP), enables excellent RF performance and high integrity interconnections. Thus, embodiments of the present invention enable wide band-gap devices for highly packed RF front-ends. For example, the integrated RF subsystems 100 (or 100-1) may fit the phased array spacing requirements (i.e., half-wavelength spacing between adjacent elements).

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

It will be understood that, although the terms "first," "second," "third," etc., may be used herein to describe various elements, components, and/or sections, these elements, components, and/or sections should not be limited by these terms. These terms are used to distinguish one element, component, or section from another element, component, or section. Thus, a first element, component, or section discussed above could be termed a second element, component, or section, without departing from the spirit and scope of the invention.

It will be understood that the spatially relative terms used herein are intended to encompass different orientations of the device in use or in operation, in addition to the orientation depicted in the figures. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the invention. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the invention refers to "one or more embodiments of the invention." Also, the term "exemplary" is intended to refer to an example or illustration.

It will be understood that when an element or component is referred to as being "connected to" or "coupled to" another element or component, it can be directly connected to or coupled to the other element or component, or one or more intervening elements or components may be present. When an element or layer is referred to as being "directly connected to" or "directly coupled to" another element or component, there are no intervening elements or components present.

As used herein, the terms "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

What is claimed is:

1. An integrated radio frequency (RF) subsystem comprising:
    a chip substrate extending along a first direction;
    a circuit patterned on a first surface of the chip substrate;
    a probe electrically integrated with the circuit on a first side of the chip substrate, the probe and the circuit extending along the first direction; and
    a frame at a second side of the chip substrate defining a first cavity underneath the circuit.

2. The integrated RF subsystem of claim 1, wherein the frame comprises:
    a first side wall and a second side wall, the first and second side walls extending along the first direction;
    a first cross wall and a second cross wall, the first and second cross walls laterally spaced from one another and extending along a second direction crossing the first direction, the first cross wall being spaced from an edge of the chip substrate; and
    a base parallel to the chip substrate,
    wherein the first cross wall, the first and second side walls, and the base define a second cavity at the edge of the chip substrate, and the first and second side walls and the first and second cross walls define the first cavity under the circuit.

3. The integrated RF subsystem of claim 2,
    wherein the first cavity opens toward a third direction away from the substrate and crossing the first and second directions, and
    wherein the second cavity opens toward the first direction.

4. The integrated RF subsystem of claim 2, wherein the second cavity is configured to match a profile of, and be electromagnetically coupled to, a waveguide, the probe being positioned at a center of a cross-section of the waveguide orthogonal to the first direction.

5. The integrated RF subsystem of claim 2, wherein a surface of the base facing the second side of the chip substrate is coated with an electrically conductive layer having a conductivity from about $30 \times 10^6$ Siemens/m to about $65 \times 10^6$ Siemens/m.

6. The integrated RF subsystem of claim 2, wherein the first cross wall is aligned with an edge of the circuit coupled to the probe.

7. The integrated RF subsystem of claim 2, wherein thicknesses of the first and second side walls and the base are substantially the same as those of corresponding walls of a waveguide coupled to the integrated RF subsystem.

8. The integrated RF subsystem of claim 1, wherein the probe comprises an e-plane probe configured to receive an electromagnetic wave signal and to transmit an electrical signal to the circuit, the electrical signal corresponding to the electromagnetic wave signal.

9. The integrated RF subsystem of claim 1, further comprising a heat spreader in the first cavity and configured to dissipate heat generated by the circuit.

10. The integrated RF subsystem of claim 9, wherein the heat spreader contacts a second surface of the chip substrate.

11. The integrated RF subsystem of claim 9, wherein the heat spreader comprises electroformed high thermal conductivity material comprising one or more of copper, copper alloys, silver, and gold.

12. The integrated RF subsystem of claim 1, wherein an entire top surface of the frame is bonded to a second surface of the chip substrate.

13. The integrated RF subsystem of claim 1, wherein the circuit comprises a monolithic microwave integrated circuit (MMIC).

14. The integrated RF subsystem of claim 1, wherein the frame comprises one or more of Si, SiC, GaAs, GaN, InP, sapphire, and quartz.

15. A method of forming a wafer-level-fabricated RF subsystem, the method comprising:
    receiving a mesh wafer having a plurality of first cavities arranged in matrix-form, and comprising a plurality of partition walls between the plurality of first cavities and extending along a first direction;
    receiving an integrated circuit (IC) wafer comprising a plurality of circuits;
    integrating a plurality of probes with the plurality of circuits on a first surface of the IC wafer;
    aligning the mesh wafer with the IC wafer such that the plurality of partition walls of the mesh wafer are aligned to dicing streets between the plurality of circuits;
    bonding the mesh wafer to a second surface of the IC wafer, the second surface facing oppositely from opposite the first surface; and
    depositing a thermal heat spreader material in the plurality of first cavities to contact the second surface of the mesh wafer.

16. The method of claim 15, wherein the first cavities are wafer-through openings and the second cavities are not wafer-through openings.

17. The method of claim 16, wherein the plurality of second cavities are coated with an electrically conductive layer to form part of a waveguide, the electrically conductive layer having a conductivity from about $30 \times 10^6$ Siemens/m to about $65 \times 10^6$ Siemens/m.

18. The method of claim 15, wherein the mesh wafer has a plurality of partial cavities arranged in matrix-form between the plurality of first cavities and the plurality of partition walls.

19. The method of claim 15, wherein each of the plurality of first cavities corresponds in size to a respective circuit of the plurality of circuits.

20. The method of claim 15, further comprising cutting the mesh wafer and the IC wafer along the dicing streets of the IC wafer to form a plurality of integrated RF subsystems, each of the plurality of integrated RF subsystems being integrated with a probe of the plurality of probes and a heat spreader of the thermal heat spreader material.

21. The method of claim 15, further comprising performing planarization to level the thermal heat spreader material with a backside of the mesh wafer, the backside facing oppositely from opposite the second surface of the IC wafer.

22. The method of claim 15, wherein the bonding further comprises attaching an entire top surface of the mesh wafer to a backside of the IC wafer.

23. The method of claim 15, wherein the depositing of the thermal heat spreader material comprises electroforming a high thermal conductivity material comprising one or more of copper, copper alloys, silver, and gold as the thermal heat spreader material.

* * * * *